(12) United States Patent
Nakamura et al.

(10) Patent No.: US 9,443,808 B2
(45) Date of Patent: Sep. 13, 2016

(54) SEMICONDUCTOR WAFER, SEMICONDUCTOR IC CHIP AND MANUFACTURING METHOD OF THE SAME

(71) Applicant: Synaptics Display Devices GK, Tokyo (JP)

(72) Inventors: Hisao Nakamura, Tokyo (JP); Yuichi Nakagomi, Tokyo (JP); Yasuhiro Kumagai, Tokyo (JP)

(73) Assignee: SYNAPTICS DISPLAY DEVICES GK, Tokyo (JP)

( * ) Notice: Subject to any disclaimer, the term of this patent is extended or adjusted under 35 U.S.C. 154(b) by 106 days.

(21) Appl. No.: 14/329,816

(22) Filed: Jul. 11, 2014

(65) Prior Publication Data

US 2015/0021733 A1 Jan. 22, 2015

(30) Foreign Application Priority Data

Jul. 18, 2013 (JP) ................................. 2013-149392

(51) Int. Cl.
| | | |
|---|---|---|
| *H01L 23/544* | (2006.01) | |
| *H01L 21/82* | (2006.01) | |
| *H01L 29/06* | (2006.01) | |
| *H01L 23/00* | (2006.01) | |
| *H01L 23/58* | (2006.01) | |
| *H01L 21/66* | (2006.01) | |
| *H01L 23/31* | (2006.01) | |

(52) U.S. Cl.
CPC ............. *H01L 23/544* (2013.01); *H01L 21/82* (2013.01); *H01L 22/34* (2013.01); *H01L 23/564* (2013.01); *H01L 23/585* (2013.01); *H01L 29/0607* (2013.01); *H01L 23/3114* (2013.01); *H01L 2924/0002* (2013.01)

(58) Field of Classification Search
CPC .......................... H01L 23/3157; H01L 23/585
See application file for complete search history.

(56) References Cited

U.S. PATENT DOCUMENTS

2006/0103025 A1* 5/2006 Furusawa et al. ............ 257/758

FOREIGN PATENT DOCUMENTS

| JP | 2006-140404 A | 6/2006 |
|---|---|---|
| JP | 2007-049066 A | 2/2007 |

* cited by examiner

*Primary Examiner* — Fernando L Toledo
*Assistant Examiner* — Valerie N Newton
(74) *Attorney, Agent, or Firm* — McGinn IP Law Group, PLLC

(57) ABSTRACT

A semiconductor wafer includes circuit integration regions each incorporating an integrated circuit and guard rings disposed to surround the circuit integration regions, respectively. A scribe region disposed between every adjacent two of the guard rings. An element and a pad electrically connected to the element are disposed in the scribe region. A groove is disposed along a corresponding guard ring on a front surface of the semiconductor wafer between the pad and the corresponding guard ring. The distance between the groove and the pad is varied along the corresponding guard ring.

18 Claims, 19 Drawing Sheets

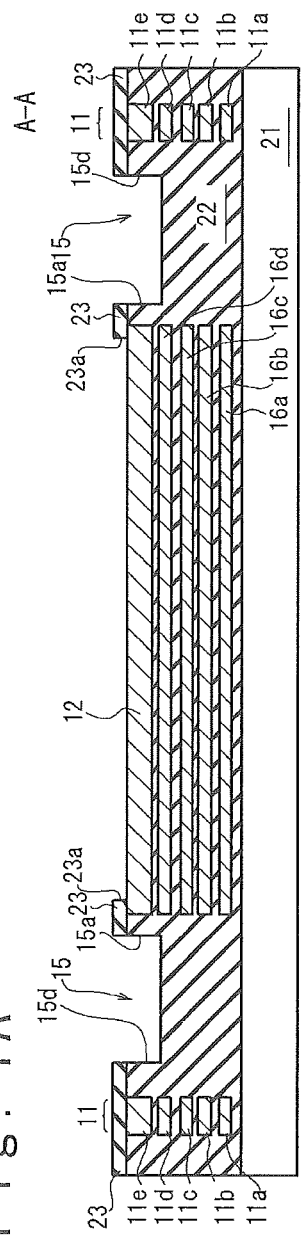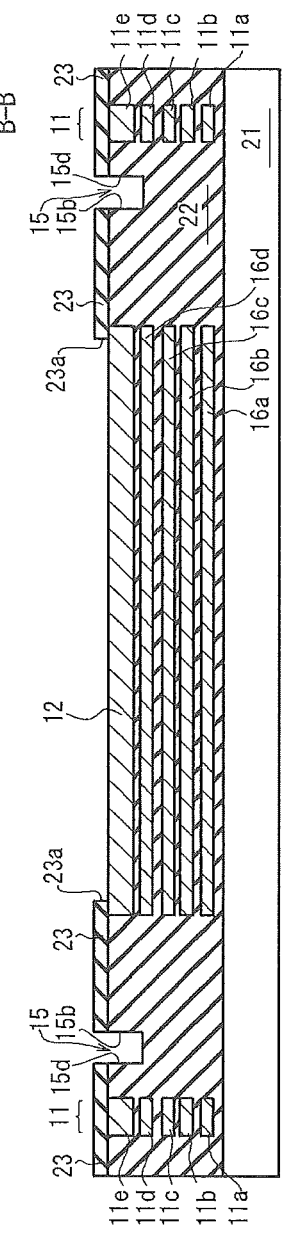

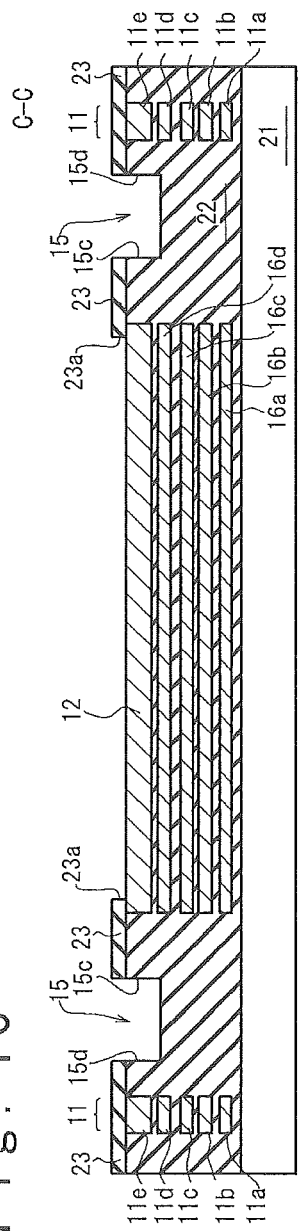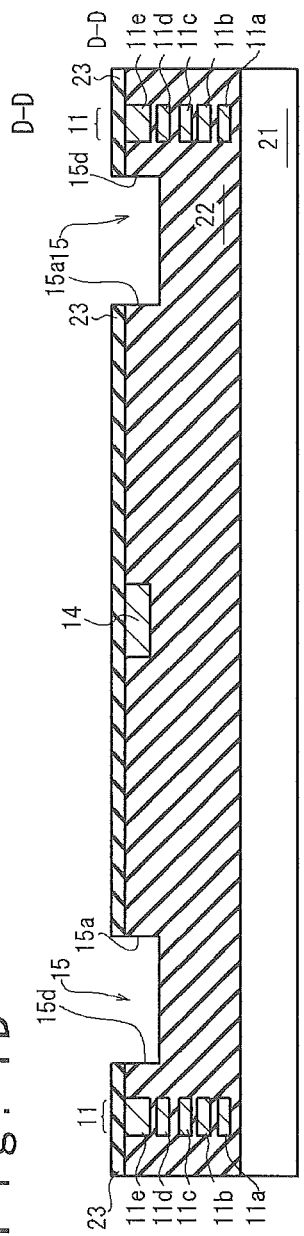

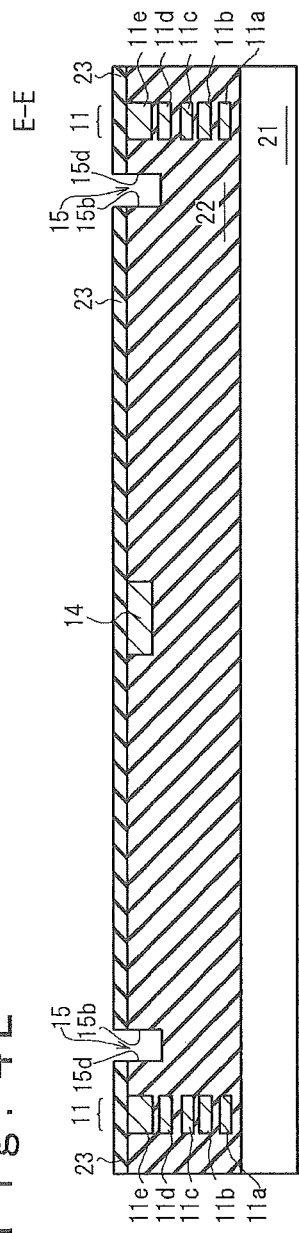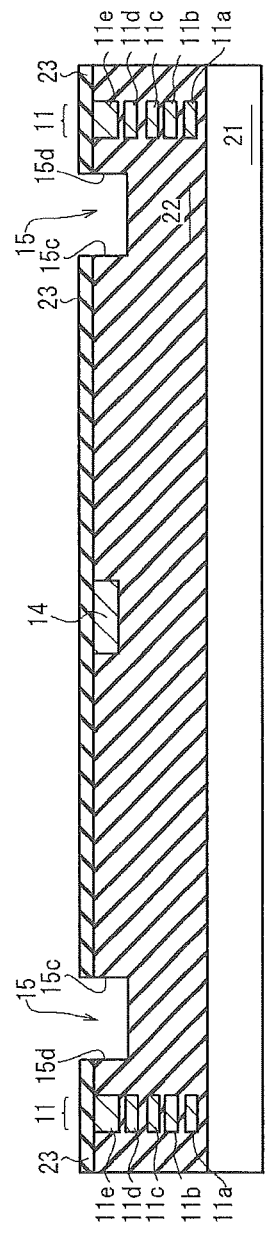

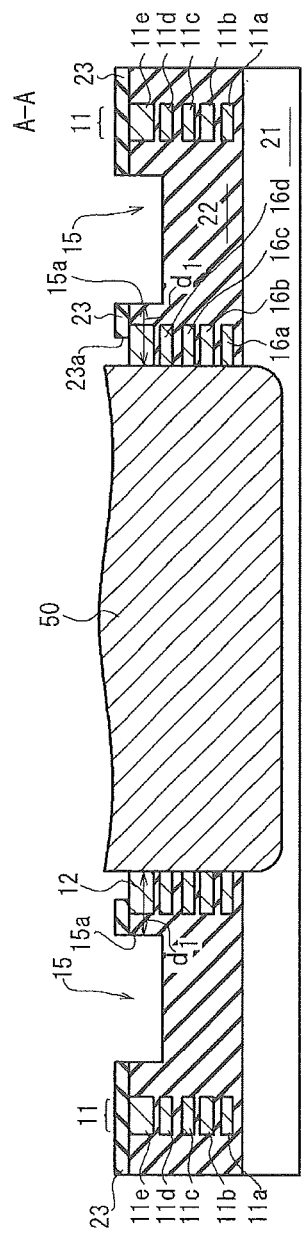

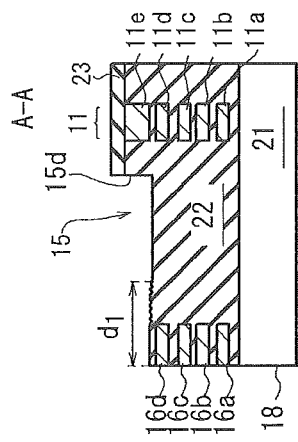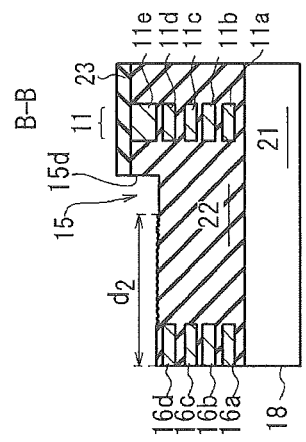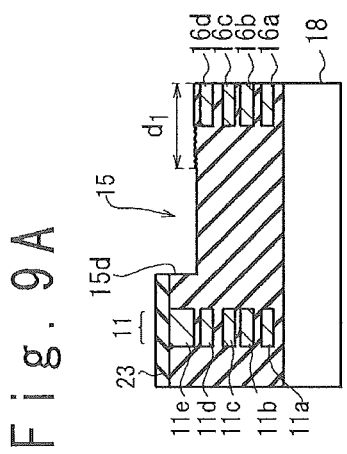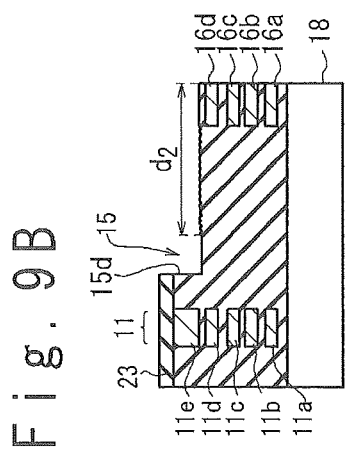

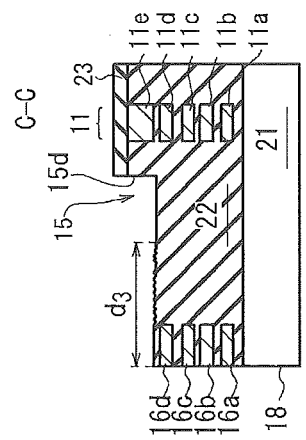
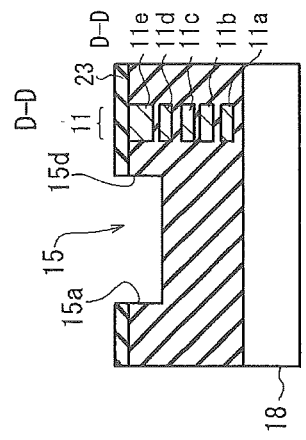
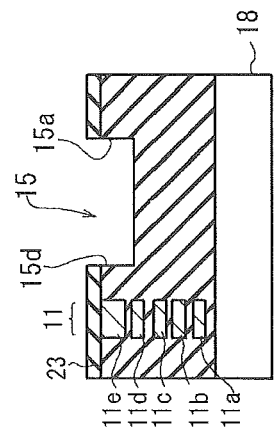

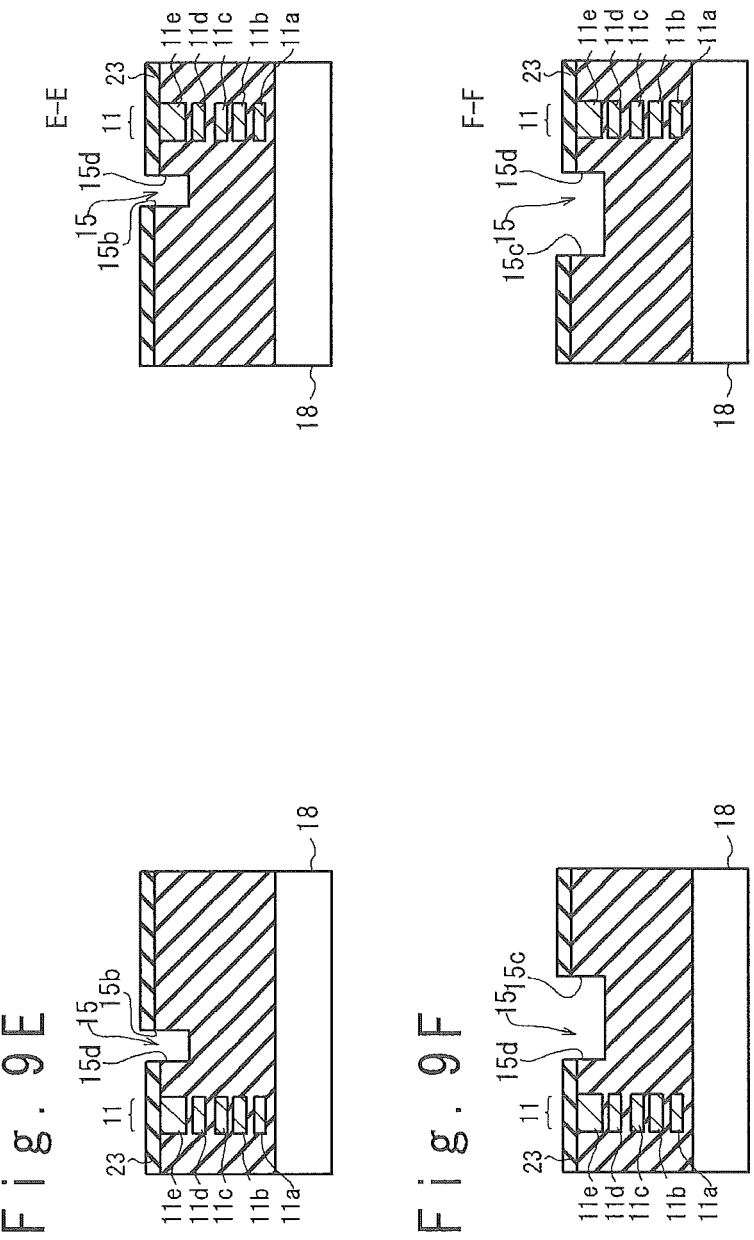

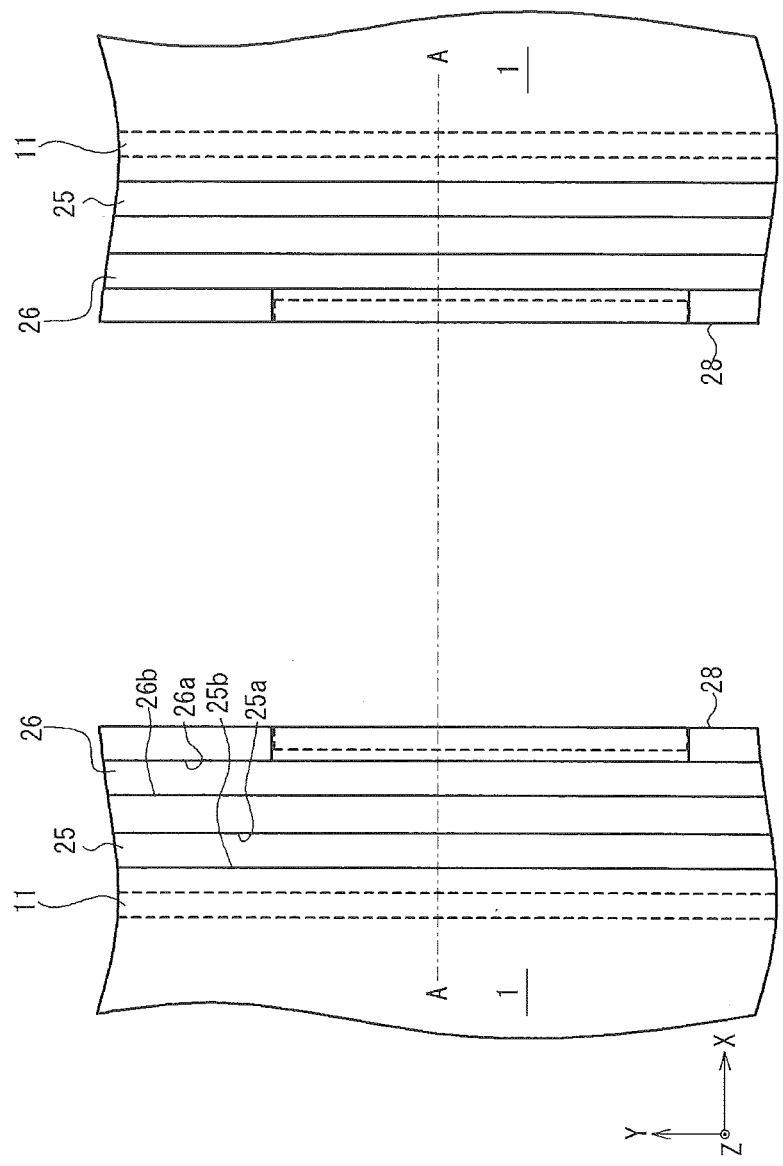

US 9,443,808 B2

SEMICONDUCTOR WAFER, SEMICONDUCTOR IC CHIP AND MANUFACTURING METHOD OF THE SAME

CROSS REFERENCE

This application claims priority of Japanese Patent Application No. 2013-149392, filed on Jul. 18, 2013, the disclosure which is incorporated herein by reference.

TECHNICAL FIELD

The present invention relates to a semiconductor wafer, semiconductor IC (integrated circuit) chip and method for manufacturing a semiconductor device, more particularly, to a scribe region structure of a semiconductor wafer and a technique for cutting a semiconductor wafer along scribe regions in manufacture of semiconductor IC chips.

BACKGROUND ART

In general, the manufacturing process of semiconductor IC chips can be grouped into two major parts: the wafer fabrication process, which involves preparing a semiconductor wafer containing multiple identical integrated circuits, and the assembly and testing process, which involves machining the semiconductor wafer into semiconductor products of a desired form. The dicing is one of the steps of the assembly and testing process, in which a semiconductor wafer containing multiple identical integrated circuits is cut into individual semiconductor IC chips. Each individual semiconductor IC chip obtained by the dicing is packaged into a desired package or mounted on a desired substrate (for example, a glass substrate of a display panel and a printed circuit board) by a surface mount technology.

In general, the dicing is achieved by cutting a semiconductor wafer with a dicing blade. A region used as a reserve for cutting a semiconductor wafer with a dicing blade is often referred to as scribe region (also referred to as dicing lane or scribe lane).

One or more TEGs (test element groups) are often integrated in a scribe region. A TEG include various test elements (for example, MOS transistor and resistor elements) and electrical characteristics of the test elements are measured in the manufacturing process of semiconductor IC chips. The measured electrical characteristics are used for the management of the manufacturing process, for example.

The electrical connection to a test element included in a TEG is achieved by using an external connection pad (hereinafter, referred to as "TEG pad") integrated in the scribe region. An electrical connection between a test element and a measuring device is established by placing a measurement probe on the TEG pad connected to the test element. TEGs (including TEG pads) integrated within a scribe region are broken and removed when the semiconductor wafer is cut with a dicing blade.

In recent semiconductor IC chips, mechanically weak films (for example, a low-permittivity dielectric film such as an organic silica glass film) are often used, and this undesirably increases surface chipping in the dicing. The occurrence of surface chipping undesirably reduces the yield of semiconductor IC chips and it is therefore desired to suppress the occurrence of surface chipping.

A structure in which a groove (or slit) is disposed along a guard ring (also referred to as "seal ring") in the scribe region has been proposed as a technique for suppressing the occurrence of surface chipping. Such structures are disclosed in, for example, Japanese Patent Application Publications Nos. 2006-140404 A and 2007-049066 A.

SUMMARY OF INVENTION

The inventors of the present invention have been considering reducing the width of the scribe region to increase the number of semiconductor IC chips obtainable from a single semiconductor wafer. The reduction in the width of the scribe regions effectively increases the number of semiconductor IC chips obtainable from a single semiconductor wafer, reducing the manufacture cost of the semiconductor IC chips. The above-mentioned two Japanese patent literatures are silent on reduction of the width of the scribe region, although these patent literatures disclose reduction of chipping.

Therefore, one objective of the present invention is to provide a technique helpful for reducing the width of the scribe region while suppressing chipping.

Other objectives and features of the present invention will be made apparent from the disclosure of the Specification and the attached drawings.

The inventors have been considering performing dicing with a thin dicing blade to reduce the width of the scribe region. Performing dicing with a thin dicing blade allows reducing the width of the scribe region with a sufficient margin (extra space for avoiding unsuccessful cutting).

One issue in dicing with a thin dicing blade is removal of TEG pads. A TEG pad is a large conductive element, and therefore an imperfect removal of a TEG pad may cause a problem in the manufacturing steps following the dicing (for example, packaging). For this reason, a dicing blade thicker than the width of the TEG pad is generally used in the dicing.

The inventors, however, have considered that the structure disclosed below enables removing a TEG pad with a dicing blade having a thickness thinner than the width of the TEG pad; the use of a dicing blade having a thickness thinner than the width of the TEG pad would allow reducing the width of the scribe region.

In an aspect of the present invention, a semiconductor wafer includes: a plurality of circuit integration regions each incorporating an integrated circuit; a plurality of guard rings disposed to surround the plurality of circuit integration regions, respectively; a scribe region disposed between adjacent two of the plurality of guard rings; an element disposed in the scribe region; a pad disposed in the scribed region and electrically connected to the element; and a groove disposed along one of the adjacent two of guard rings on a front surface of the semiconductor wafer. The groove is disposed to pass between the pad and the one of the plurality of guard rings. The first distance between the pad and the groove on a first section which passes the pad and is orthogonal to an extending direction in which the one of the adjacent two of guard rings is extended is different from the second distance between the pad and the groove on a second section which passes the pad and is orthogonal to the extending direction, the second section being positioned at a position different from that of the first section in the extending direction.

In another aspect of the present invention, a semiconductor wafer includes: a plurality of circuit integration regions each incorporating an integrated circuit; a plurality of guard rings disposed to surround the plurality of circuit integration regions, respectively; a scribe region disposed between adjacent two of the plurality of guard rings; an element disposed in the scribe region; a pad disposed in the scribed region and electrically connected to the element; and first and second grooves disposed on a front surface of the semiconductor wafer. The first and second grooves are disposed to pass between the pad and the one of the adjacent two of guard rings. The first groove is disposed between the one of the adjacent two of guard rings and the pad to extend along the one of the adjacent two of guard rings. The second groove is disposed between the first groove and the pad to extend along the first groove.

In still another aspect of the present invention, a manufacturing method of a semiconductor IC chip includes: preparing a semiconductor wafer structured as described above; and performing a dicing of the semiconductor wafer with a dicing blade to obtain a semiconductor IC chip. The thickness of the dicing blade is thinner than a width of the pad in a direction orthogonal to the extending direction.

In still another aspect of the present invention, a semiconductor IC chip includes: a circuit integration region incorporating an integrating circuit; and a guard ring disposed to surround the circuit integration region. A groove is formed on a front surface of the semiconductor IC chip along the guard ring to pass between a side edge face of the semiconductor IC chip and the guard ring. The first distance between the side edge face and the groove on a first section which is orthogonal to an extending direction in which the guard ring is extended is different from a second distance between the side edge face and the groove on a second section which is orthogonal to the extending direction and positioned at a position different from that of the first section in the extending direction.

In still another aspect of the present invention, a semiconductor IC chip includes: a circuit integration region incorporating an integrating circuit; and a guard ring disposed to surround the circuit integration region. First and second grooves are formed on a front surface of the semiconductor IC chip to pass between a side edge face of the semiconductor IC chip and the guard ring. A first groove is formed to pass between the side edge face of the semiconductor IC chip and the guard ring, extending along the guard ring. A second groove is formed between the first groove and the side edge face, extending along the first groove.

The present invention provides a technique useful for reducing the width of a scribe region, while suppressing occurrence of chipping.

BRIEF DESCRIPTION OF THE DRAWINGS

The above and other advantages and features of the present invention will be more apparent from the following description taken in conjunction with the accompanied drawings, in which:

FIGS. 4A to 4F are section views illustrating the structure of the semiconductor wafer in the scribe region in the first embodiment;

FIGS. 7A and 7B are section views illustrating an exemplary state of the semiconductor wafer in dicing in the first embodiment;

FIGS. 9A to 9F are section views illustrating the structure of the side edge portion of the semiconductor IC chip obtained by dicing the semiconductor wafer of the first embodiment;

FIG. 14 is a plan view illustrating an exemplary structure of the side edge portion of a semiconductor IC chip obtained by dicing the semiconductor wafer of the second embodiment; and FIG. 15 is a section view illustrating the structure of the side edge portion of the semiconductor IC chip obtained by dicing the semiconductor wafer of the second embodiment.

DESCRIPTION OF PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

First Embodiment

Figure 1:
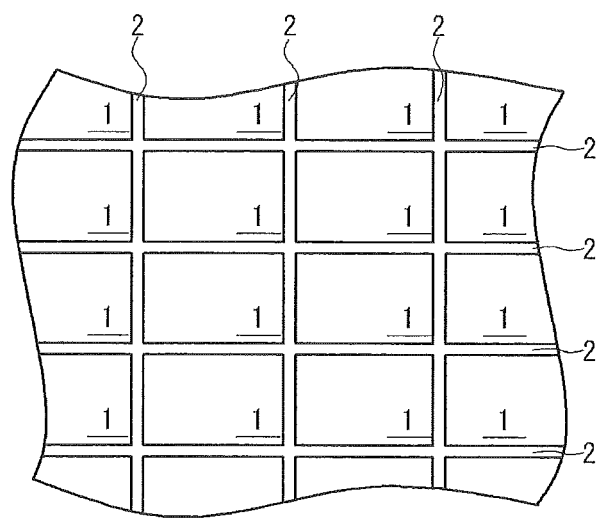
FIG. 1 is a plan view partially illustrating an exemplary structure of a semiconductor wafer in a first embodiment of the present invention.

FIG. 1 is a plan view partially illustrating an exemplary structure of a semiconductor wafer in a first embodiment of the present invention. The semiconductor wafer of this embodiment includes a plurality of circuit integration regions 1 each incorporating an integrated circuit. A scribe region 2 is disposed between every two adjacent circuit integration regions 1. As described above, the scribe regions 2 are used as reserves for cutting in dicing the semiconductor wafer. As described later, semiconductor IC chips each including a circuit integration region 1 are obtained by performing dicing along the scribe regions 2.

Figure 2:
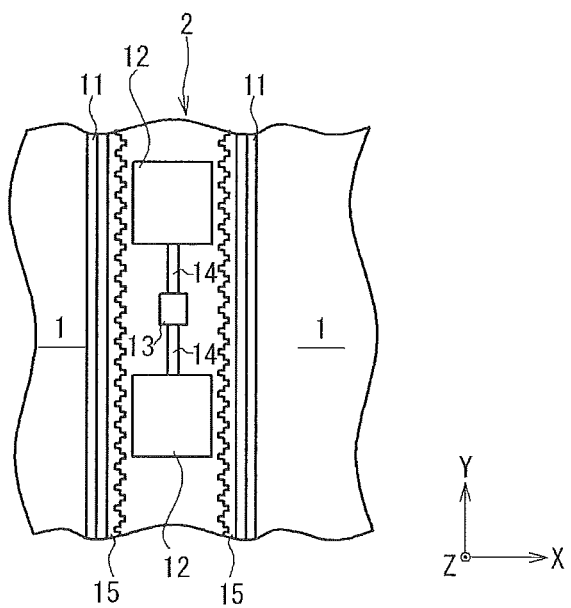
FIG. 2 is a plan view illustrating an exemplary structure of the semiconductor wafer in a scribe region in the first embodiment.

FIG. 2 is a plan view illustrating an exemplary structure of the semiconductor wafer in a scribe region 2 in the first embodiment. It should be noted that the following description often refers to an XYZ Cartesian coordinate system to indicate the direction. In this Cartesian coordinate system, the Y-axis is defined as being directed in the direction in which a guard ring 11 is extended (that is, the direction in which the scribe region 2 is extended) and the X-axis is defined as being directed in the direction orthogonal to the direction in which the guard ring 11 is extended (that is, the direction crossing the scribe region 2), while the Z-axis is defined as being directed in the thickness direction of the semiconductor wafer.

In the semiconductor wafer of this embodiment, a guard ring (seal ring) 11 is integrated to surround each circuit integration region 1. The guard ring 11 is a structure disposed to avoid deterioration of the device performance characteristics due to invasion of water from the side edge face of the semiconductor IC chip. As described later, each guard ring includes a plurality of metal wires arrayed in the thickness direction of the semiconductor wafer and metal via-contacts each connected between two metal wires adjacent in the thickness direction. Each metal wire within the guard ring 11 is extended along the edge of the circuit integration region 1. In the semiconductor wafer of this embodiment, each scribe region 2 is disposed between adjacent two guard rings (that is, two guard rings 11 respectively disposed along adjacent two circuit integration regions 1).

A test element group (TEG) is integrated within each scribe region 2. In this embodiment, integrated in each scribe region 2 are TEG pads 12, a test element 13 and interconnections 14 which respectively connect the TEG pads 12 to the test element 13. Although the test element 13 is illustrated as a two-terminal element in FIG. 2, the test element 13 is not limited to a two-terminal element. When an element other than a two-terminal element is used as the test element 13, the numbers of TEG pads 12 and interconnections 14 are accordingly modified.

Grooves (or slits) 15 are respectively formed along the guard rings 11 on the front surface of the semiconductor wafer of this embodiment. In this embodiment, the grooves 15 are formed so as to pass through between the guard rings 11 and the TEG pad 12. As discussed later in detail, the in-plane structure of the grooves 15 is of importance in this embodiment.

Figure 3:
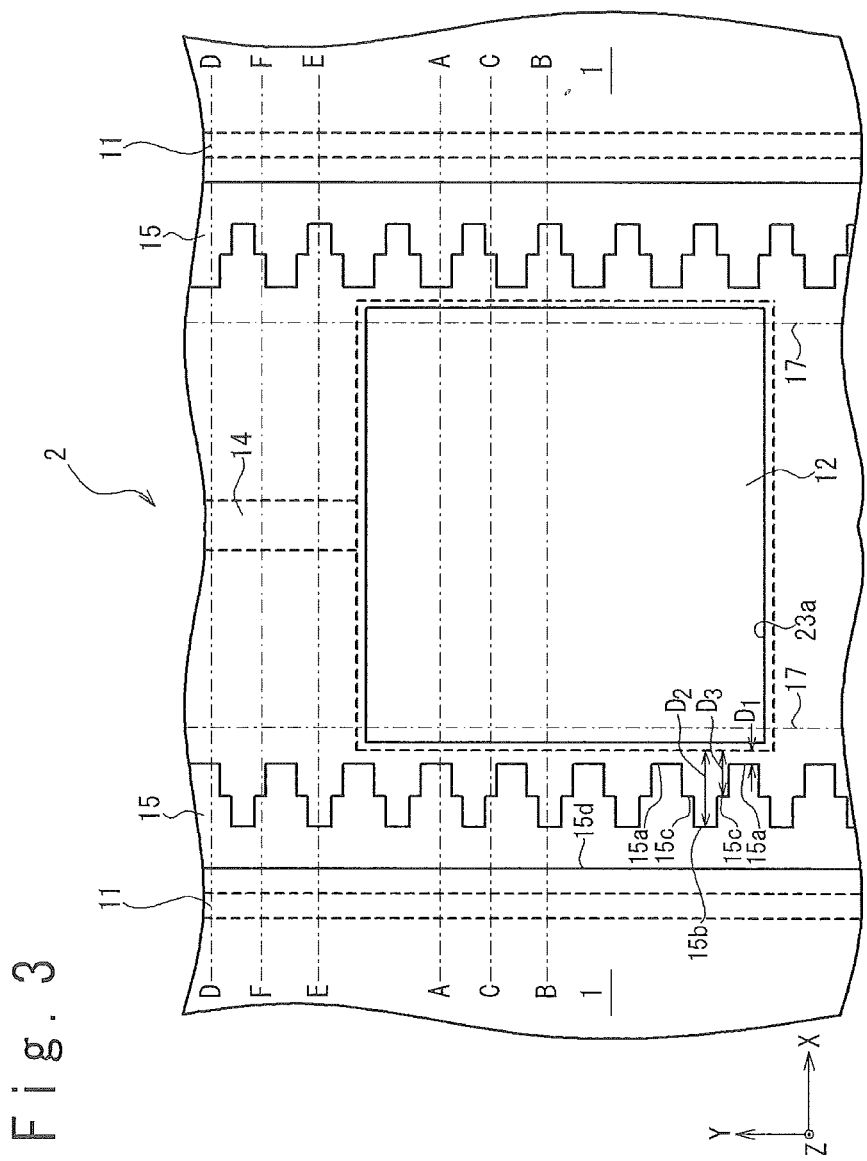
FIG. 3 is an enlarged plan view illustrating the structure of the semiconductor wafer in the scribe region in the first embodiment.

FIG. 3 is an enlarged plan view illustrating details of the structure of the semiconductor wafer in the scribe region 2 in this embodiment. FIGS. 4A to 4F are a set of section views illustrating the structure of the semiconductor wafer in the first embodiment on the A-A, B-B, C-C, D-D, E-E and F-F sections illustrated in FIG. 3. All of the A-A, B-B, C-C, D-D, E-E and F-F sections are orthogonal to the direction in which the guard rings 11 are extended (that is, the Y-axis direction). It should be noted that FIGS. 4A to 4F schematically illustrates the section structure of the semiconductor wafer in this embodiment for easy understanding of the present invention; details of the structure of the semiconductor wafer may be variously modified.

As illustrated in FIGS. 4A to 4F, the semiconductor wafer of this embodiment includes: a semiconductor substrate 21 in which transistors and other elements (not shown) are integrated; a dielectric layer 22 disposed to cover the semiconductor substrate 21; and a surface protection layer (passivation layer) 23 formed to cover the dielectric layer 22.

Each guard ring 11 includes metal wires 11a to 11e formed within the dielectric layer 22. The metal wires 11a to 11e are arrayed in the thickness direction of the semiconductor substrate 21.

The TEG pad 12 is formed between the adjacent guard rings 11. The TEG pad 12 is partially covered with the surface protection layer 23 on the periphery and exposed in an opening 23a formed through the surface protection layer 23. It should be noted that the TEG pad 12 is illustrated in FIGS. 4A, 4B and 4C, which illustrate the structures on the A-A, B-B and C-C sections, while only an interconnection 14 connected to the TEG pad 12 is illustrated in FIGS. 4D, 4E and 4F, which illustrate the structures on the D-D, E-E and F-F sections.

In addition, metal wires 16a to 16d are disposed below the TEG pad 12. The metal wires 16a to 16d are arrayed in the thickness direction of the semiconductor substrate 21.

Figure 5:
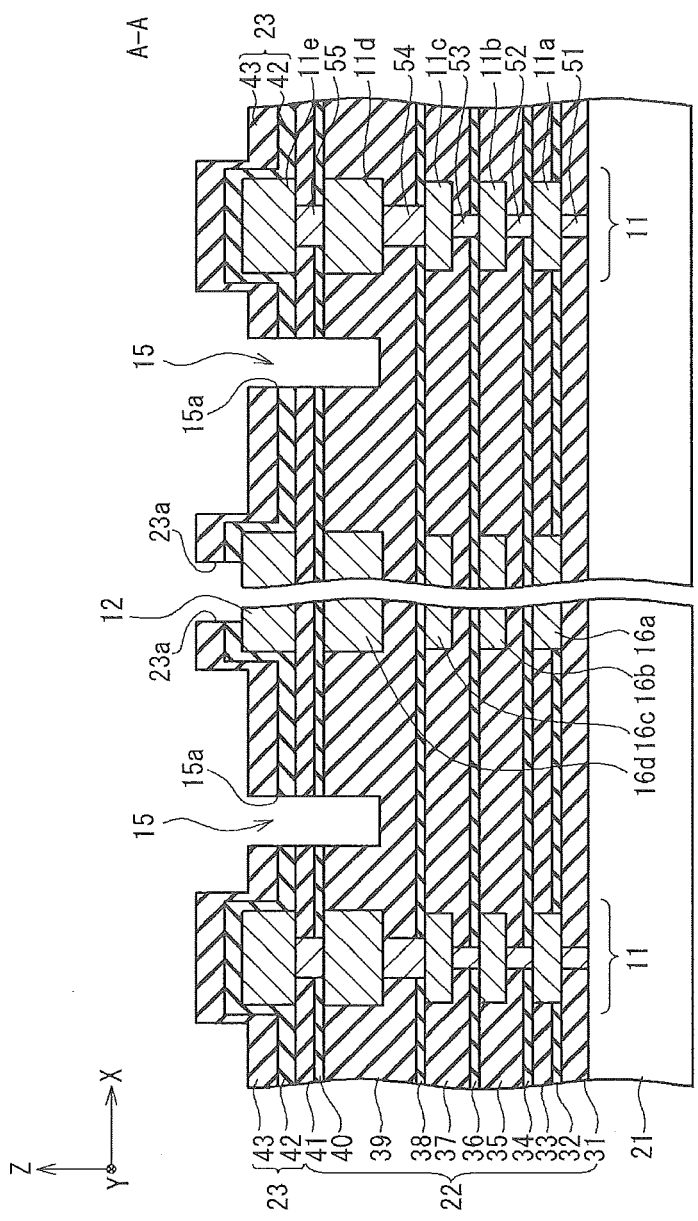
FIG. 5 is a section view illustrating details of the structure of the semiconductor wafer in the scribe region in the first embodiment.

FIG. 5 is a section view illustrating details of the structure of the semiconductor wafer in this embodiment. It should be noted that the dimensions of the structure of the semiconductor wafer of this embodiment (for example, the thickness of the semiconductor substrate 21) are not illustrated in FIG. 5 as being proportional to actual dimensions of actual products, for easy understanding of the structure of the semiconductor wafer of this embodiment.

The front surface of the semiconductor substrate 21 is covered with the dielectric layer 22. In this embodiment, the dielectric layer 22 includes a silicon oxide film 31, a silicon carbonitride film 32, a silicon oxide film 33, a silicon carbonitride film 34, a low-permittivity dielectric film 35, a silicon carbonitride film 36, a low-permittivity dielectric film 37, a silicon carbonitride film 38, a silicon oxide film 39, a silicon carbonitride film 40 and a silicon oxide film 41, which are laminated in this order. Dielectric films formed of organic silica glass with the relative permittivity less than 3.3 may be used as the low-permittivity dielectric film 35 and 37, for example.

The metal wires 11a of the guard rings 11 and the metal wire 16a disposed under the TEG pad 12 are embedded in the grooves formed through the silicon carbonitride film 32 and the silicon oxide film 33, and the metal wires 11b and 16b are embedded in the grooves formed on the low-permittivity dielectric film 35. The metal wires 11c and 16c are, on the other hand, embedded in the grooves formed on the low-permittivity dielectric film 37 and the metal wires 11d and 16d are embedded in the grooves formed on the silicon oxide film 39. The metal wires 11e and the TEG pad 12 are formed on the silicon oxide film 41. The metal wires 11a are connected to diffusion layers (not shown) of the semiconductor substrate 21 through via-contacts 51 formed through the silicon oxide film 31, and the metal wires 11b are connected to the metal wires 11a through via-contacts 52 formed through the low-permittivity dielectric film 35 and the silicon carbonitride film 34. Similarly, the metal wires 11c are connected to the metal wires 11b through via-contacts 53 formed through the low-permittivity dielectric film 37 and the silicon carbonitride film 36 and the metal wires 11d are connected to the metal wires 11c through via-contacts 54 formed through the silicon oxide film 39 and the silicon carbonitride film 38. In one embodiment, the metal wires 11a to 11d and 16a to 16d may be formed of copper wires, and the metal wires lie and the TEG pad 12 may be formed of aluminum alloy.

The surface protection layer 23 includes a silicon oxide film 42 and a silicon nitride film 43 which are laminated in this order. The silicon oxide film 42 and the silicon nitride film 43 are formed to cover the metal wires 11e of the guard rings 11 and to also partially cover the TEG pad 12. The opening 23a is formed through the silicon oxide film 42 and the silicon nitride film 43 and the TEG pad 12 is exposed in the opening 23a.

The grooves 15 are formed between the guard rings 11 and the TEG pad 12. The grooves 15 are formed to penetrate at least the surface protection layer 23 in the thickness direction. In this embodiment, the grooves 15 are formed to reach intermediate positions of the silicon oxide film 39 in the thickness direction. It should be noted that the grooves 15 do not reach the low-permittivity dielectric film 35 and 37. This aims at reducing generation of a crack by forming the grooves 15 only through the silicon oxide films 39, 41, 42 and the silicon nitride film 43, which are formed of materials having Young's moduli higher than that of the low-permittivity dielectric films 35 and 37.

Although FIG. 5 illustrates the structure of the semiconductor wafer on the A-A section, the structures of the semiconductor wafer on the B-B and C-C sections are the same as that on the A-A section except for that the width of the grooves 15 in the X-axis direction is different. The structures of the semiconductor wafer on the D-D, E-E and F-F sections are the same as those on the A-A, B-B and C-C sections, respectively, except for that an interconnection 14 is disposed in place of the TEG pad 12 and the metal wires 16a to 16d.

Referring back to FIG. 3, the in-plane shape of each groove 15 is of importance in the structure of the semiconductor wafer of this embodiment. It is of significance that, with respect to sections which pass the TEG pad 12 and are orthogonal to the Y-axis direction (the direction in which the guard rings 11 are extended), there are a section on which the distance between the TEG pad 12 and the grooves 15 is reduced (for example, the A-A section) and a section on which the distance between the TEG pad 12 and the grooves 15 is increased (for example, the B-B section). As discussed later in detail, the existence of a section on which the distance between the TEG pad 12 and the grooves 15 is reduced enables removing the TEG pad 12 in the dicing, even when a dicing blade thinner than the width of the TEG pad 12 in the X-axis direction is used. This contributes to the reduction in the width of the scribe region 2.

The existence of a section on which the distance between the TEG pad 12 and the grooves 15 is increased is effective for reducing chipping.

Figure 6:
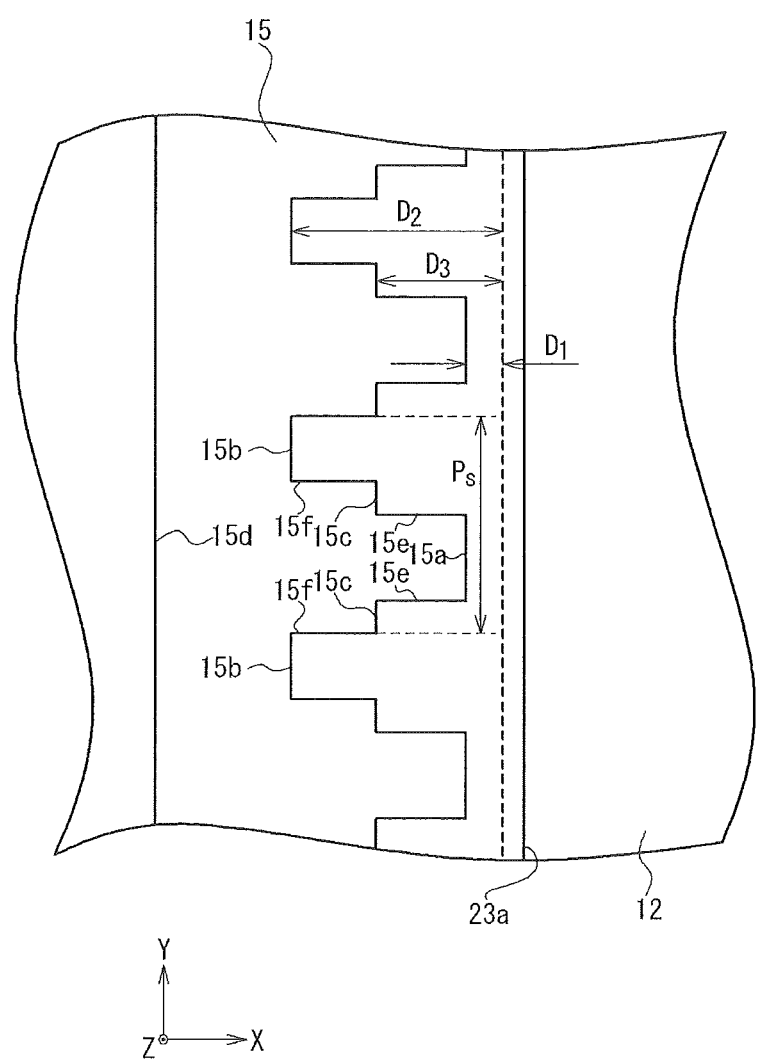
FIG. 6 is a plan view illustrating details of the structure of a groove disposed on the semiconductor wafer in the first embodiment.

FIG. 6 is a plan view illustrating details of the in-plane shape of a groove 15. As illustrated in FIG. 6 (and FIG. 3), the side face 15d opposed to the guard ring 11 of the groove 15 is parallel to the YZ plane and extended in the Y-axis direction. The side face opposed to the TEG pad 12 of the groove 15 is formed into a stepped structure. In detail, the side face along the TEG pad 12 of the groove 15 includes: faces 15a, 15b and 15c which are parallel to the YZ plane; and faces 15e and 15f which are parallel to the XZ plane. The faces 15e are extended in the X-axis direction to connect the faces 15a and 15c, and the faces 15f are extended in the X-axis direction to connect the faces 15b and 15c. In FIG. 6, the numeral $D_1$ denotes the distance between the face 15a of the groove 15 and the TEG pad 12, the numeral $D_2$ denotes the distance between the faces 15b of the groove 15 and the TEG pad 12 and the numeral $D_3$ denotes the distance between the faces 15c of the groove 15 and the TEG pad 12. In the structure illustrated in FIG. 6, the distance $D_1$ between the TEG pad 12 and the groove 15 is relatively reduced on the A-A section, and the distance $D_2$ between the TEG pad 12 and the groove 15 is relatively increased on the B-B section. The distance $D_3$ between the TEG pad 12 and the groove 15 is larger than the distance $D_1$ and smaller the distance $D_2$ on the C-C section.

In this embodiment, the shape of the groove 15 is periodic in the Y-axis direction; the shape of the side face of each groove 15 along the TEG pad 12 is periodic in the Y-axis direction in which a face consisting of the faces 15b, 15f, 15d, 15e, 15a, 15e, 15c and 15f are repeated at a spatial period $P_s$.

The above-described in-plane shape of the grooves 15 in the present invention effectively reduces the chipping, while advantageously allowing dicing with a dicing blade thinner than the width of the TEG pad 12 in the X-axis direction. Discussed in the following are advantages of the in-plane shape of the grooves 15 in this embodiment. FIG. 7 is a section view illustrating an exemplary state of the semiconductor wafer when a dicing is performed with a dicing blade placed into contact with the semiconductor wafer at a position between the dashed lines 17 illustrated in FIG. 3.

One advantage of the semiconductor wafer of this embodiment is that the TEG pad 12 can be removed by a dicing with a dicing blade 50 having a thickness slightly thinner than the width of the TEG pad 12 in the X-axis direction. It should be noted that the dicing blade 50 is illustrated in FIG. 7 as being thinner than the width of the TEG pad 12 in the X-axis direction.

When a dicing blade 50 having a thickness thinner than the width of the TEG pad 12 in the X-axis direction is used, this results in that a portion of the TEG pad 12 is not in direct contact with the dicing blade 50; such portion is referred to as "non-contact portion", hereinafter.

Here, the non-contact portion of the TEG pad 12 is applied with a force to strip off the non-contact portion by the dicing blade 50. The use of this force allows removing the whole of the TEG pad 12 in the semiconductor wafer of this embodiment. In detail, when the dicing blade 50 is put against the TEG pad 12 at the center thereof, as shown in FIG. 7A, the distance $d_1$ between the dicing blade 50 and the grooves 15 is reduced on a section on which the distance between the TEG pad 12 and the grooves 15 is reduced (in this embodiment, the A-A section). Accordingly, when a force is applied to strip off each non-contact portion of the TEG pad 12, this force tends to be released at a position of each groove 15 at which the distance between the TEG pad 12 and each groove 15 is reduced. In other words, the portions of the surface protection layer 23 between the faces 15a of the grooves 15 and the TEG pad 12 tend to be broken by applying forces to strip off the non-contact portions with the dicing blade 50. Even when there remain non-contact portions in the TEG pad 12, which are not in direct contact with the dicing blade 50, the non-contact portions can be removed together with the portions of the surface protection layer 23 between the faces 15a of the grooves 15 and the TEG pad 12.

As thus discussed, the structure of the semiconductor wafer in this embodiment permits performing dicing with a dicing blade 50 having a thickness thinner than the width of the TEG pad 12 in the X-axis direction. This allows reducing the width of the scribe region 2. The width of the scribe region 2 is determined depending on the sum of the thickness of the dicing blade 50 and the distance to be secured between the guard rings 11 and the dicing blade 50. Note that it is necessary to secure a certain distance between the guard rings 11 and the dicing blade 50 in the dicing, in order to avoid damage to semiconductor IC chips to be finally obtained. The use of the structure of the semiconductor wafer in this embodiment, which permits using a thin dicing blade 50, accordingly allows reducing the width of each scribe region 2.

Figure 7B:
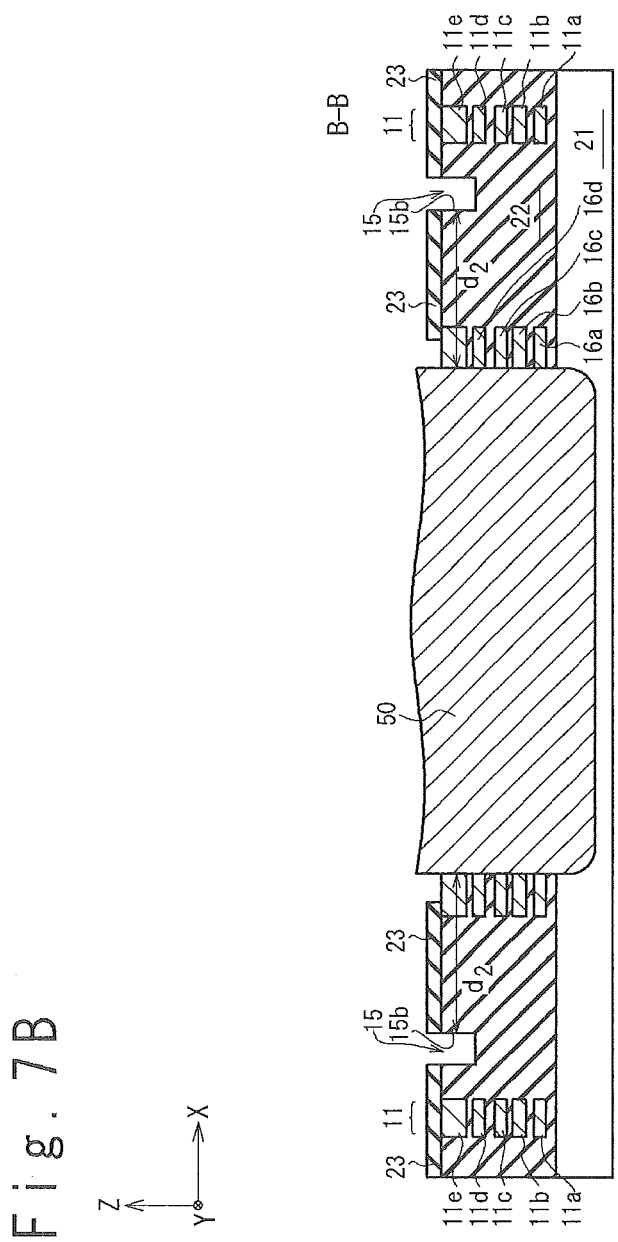

On the B-B section on which the distance between the TEG pad 12 and the grooves 15 is increased, on the other hand, as shown in FIG. 7B, the distance $d_2$ between the dicing blade 50 and the grooves 15 is increased and this contributes to suppression of the surface chipping. When the dicing blade 50 is placed into contact with the semiconductor wafer at a scribe region 2, a crack is generated on the rear surface of the semiconductor substrate 21 at a position near the center of the dicing blade 50 in the thickness direction of the dicing blade 50. The crack grows in the X-axis direction (that is, the direction crossing the scribe region 2), and approaches the front surface of the semiconductor wafer as the crack grows in the X-axis direction. A groove 15 has the effect of stopping the growth of this crack. The effect of stopping the growth of the crack is effectively obtained as the distance between the groove 15 and the dicing blade 50 is increased. Accordingly, the existence of a section on which the distance between the TEG pad 12 and the groove 15 is increased (in this embodiment, the B-B section, for example) effectively suppresses the surface chipping.

Furthermore, the existence of the C-C section, on which the distance between the TEG pad 12 and the grooves 15 is intermediate, effectively allows propagating the break-down of the portions of the surface protection layer 23 between the faces 15a of the grooves 15 and the TEG pad 12, which has occurred on the A-A section, to the B-B section. The existence of the C-C section between the A-A and B-B sections, on which the distance between the TEG pad 12 and the grooves 15 is intermediate, effectively improves the reliability of the removal of the TEG pad 12.

Figure 8:
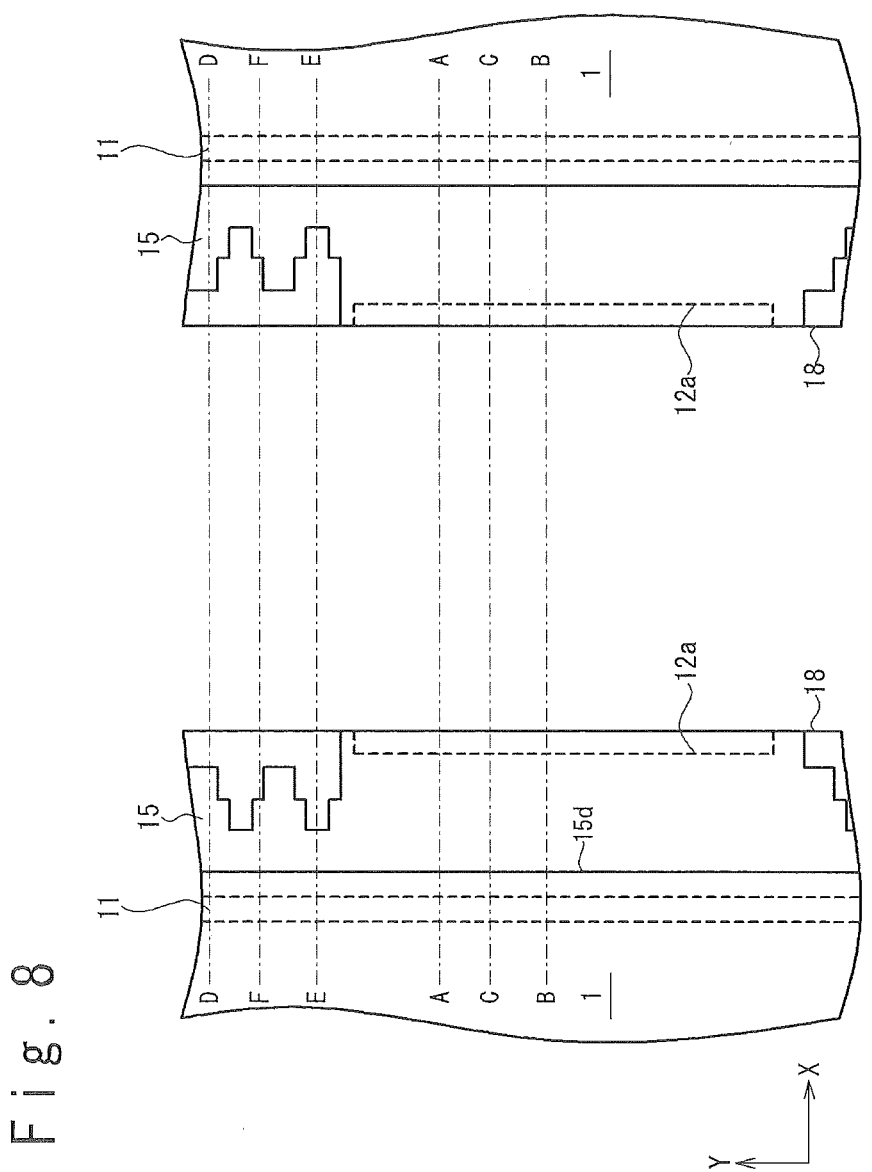
FIG. 8 is a plan view illustrating an exemplary structure of the side edge portion of a semiconductor IC chip obtained by dicing the semiconductor wafer of the first embodiment.

FIG. 8 is a plan view illustrating an exemplary structure of the side edge portion of a semiconductor IC chip obtained by dicing the semiconductor wafer with a dicing blade 50 having a thickness thinner than the width of the TEG pad 12 in the X-axis direction, and FIGS. 9A to 9F are section views illustrating the structure of the side edge portion of the semiconductor IC chip. In FIG. 8, the numeral 18 denotes the cut surface of the dicing, that is, the side edge face of the semiconductor IC chip and the broken lines 12a indicate the position at which the TEG pad 12 has existed before the dicing.

When a dicing is performed with a dicing blade 50 having a thickness thinner than the width of the TEG pad 12 in the X-axis direction, a force is applied to strip off the TEG pad 12 near a position at which the TEG pad 12 has existed before the dicing. This force breaks down the surface protection layer 23 and also removes the TEG pad 12.

A resultant semiconductor IC chip has a structure in which the distance $d_1$ between the side edge face 18 and the groove 15 is relatively reduced on the A-A section and the distance $d_2$ between the side edge face 18 and the groove 15 is relatively increased on the B-B section. In the meantime, the distance $d_3$ between the side edge face 18 and the groove 15 on the C-C section is larger than the distance $d_1$ and smaller than the distance $d_2$.

Note that the side face opposed to the side edge face 18 of a groove 15 may be broken in the dicing. FIG. 9A illustrates the structure in which the side face opposed to the side edge face 18 of a groove 15 is partially broken. The face formed by the break-down in the dicing is, however, structurally distinguishable from the bottom and side faces of the groove 15 formed by etching. Accordingly, the distance between the side edge face 18 and the groove 15 can be determined for an actual semiconductor IC chip.

As illustrated in FIG. 9A, the portions between the cut surface and the guard ring 11 out of the metal wires 16a to 16d positioned under the TEG pad 12 remain in the semiconductor IC chip even after the dicing. The existence of the remaining portions of the metal wires 16a to 16d may be evidence that a dicing blade 50 having a thickness thinner than the width of the TEG pad 12 in the X-axis direction is used in the dicing.

As thus described, the structure of the semiconductor wafer in this embodiment permits reducing the width of the scribe regions 2, while suppressing the surface chipping.

It should be noted that the shape of a groove which pass between a guard ring 11 and a TEG pad 12 may be variously modified in this embodiment, under a condition that there are a section on which the distance between the TEG pad 12 and the groove 15 is relatively reduced and a section on which the distance between the TEG pad 12 and the groove 15 is relatively increased, with respect to sections which are orthogonal to the Y-axis direction and pass the TEG pad 12.

Figure 10:
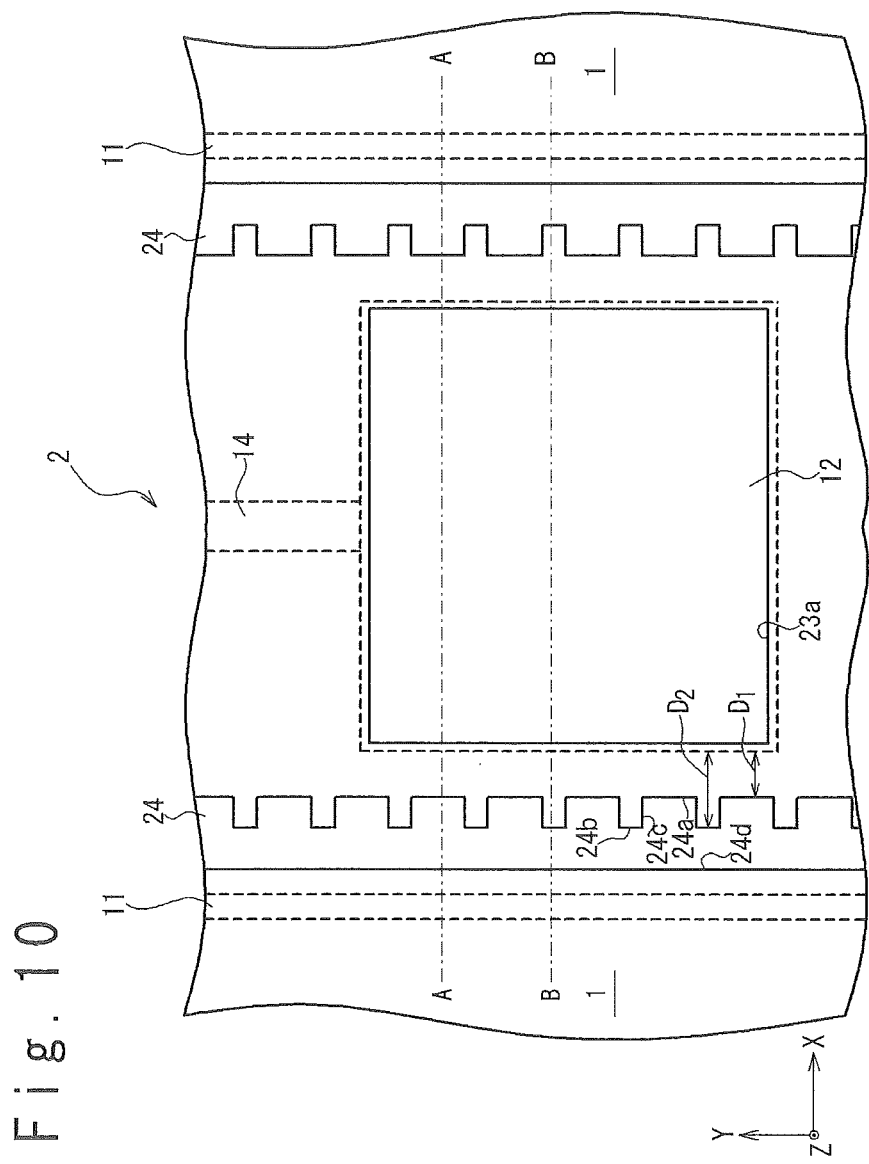
FIG. 10 is a plan view illustrating another exemplary structure of the groove disposed on the semiconductor wafer in the first embodiment.

FIG. 10 is a plan view illustrating the structure of a semiconductor wafer with grooves 24 formed in a shape different from that of the grooves 15 illustrated in FIG. 3. As illustrated in FIG. 10, the side face 24d opposed to the corresponding guard ring 11 of each groove 24 is parallel to the YZ plane and extended in the Y-axis direction. The side face of each groove 24 opposed to the TEG pad 12 includes faces 24a and 24b parallel to the YZ plane and faces 24c parallel to the XZ plane. Each face 24c is extended in the X-axis direction to connect the faces 24a and 24b. In FIG. 10, the numeral $D_1$ denotes the distance between the faces 24a of each groove 24 and the TEG pad 12 and the numeral $D_2$ denotes the distance between the faces 24b of the groove 24 and the TEG pad 12. In the structure illustrated in FIG. 10, the distance $D_1$ between the TEG pad 12 and each groove 24 is relatively reduced on the A-A section and the distance $D_2$ between the TEG pad 12 and the groove 24 is relatively increased on the B-B section.

Such structure also permits reducing the width of the scribe region 2, while suppressing the surface chipping. The existence of a section on which the distance between the TEG pad 12 and the groove 24 is reduced (for example, the A-A section) enables removing the TEG pad 12 in the dicing with a dicing blade having a thickness thinner than the width of the TEG pad 12 in the X-axis direction. This contributes to the reduction in the width of the scribe region 2. On the other hand, the existence of a section on which the distance between the TEG pad 12 and the groove 24 is increased (for example, the B-B section) effectively suppresses the chipping.

It should be noted that the in-plane shape of a groove is not limited to those illustrated in FIGS. 3 and 10. For example, the faces 24c connecting the faces 24a and 24b may be formed obliquely with respect to the faces 24a and 24b (for example, at an angle of 45 degree), although the faces 24c are illustrated as being orthogonal to the faces 24a and 24b in FIG. 10.

Second Embodiment

Figure 11:
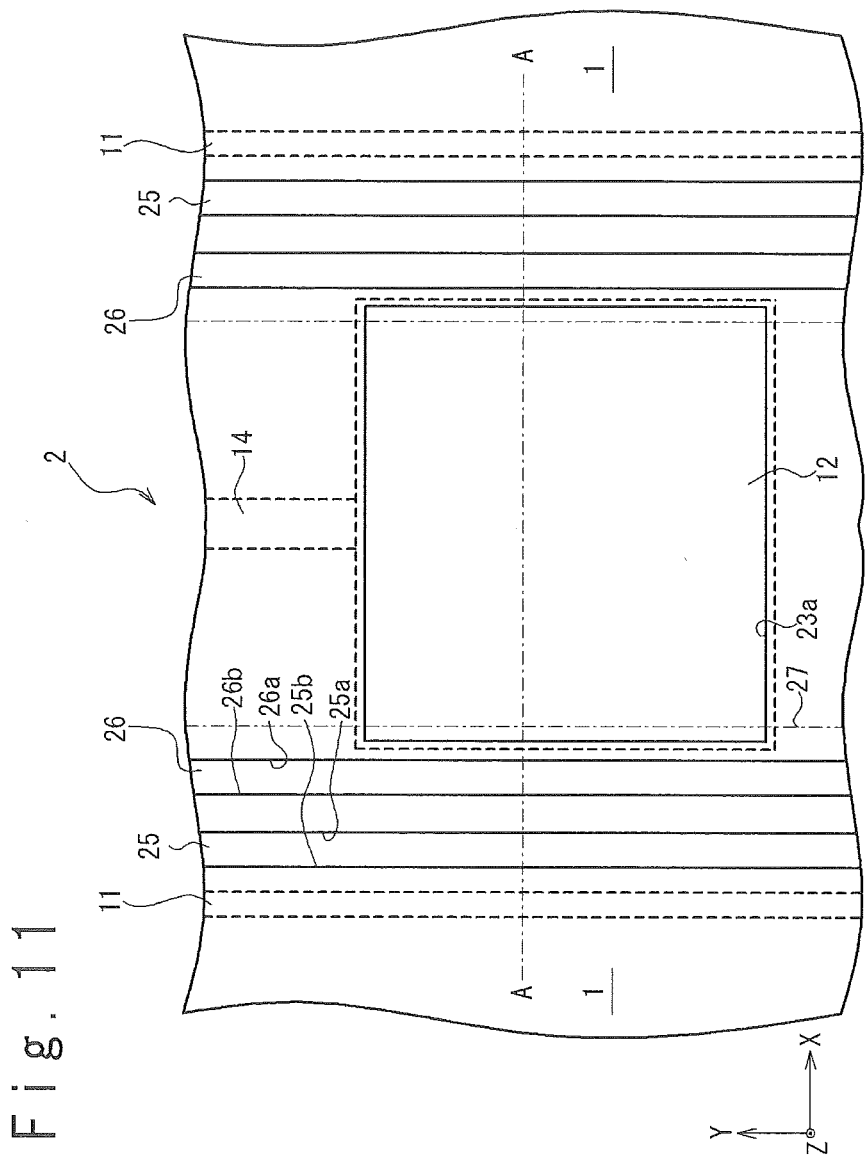
FIG. 11 is an enlarged plan view illustrating an exemplary structure of a semiconductor wafer in a second embodiment of the present invention.
Figure 12:
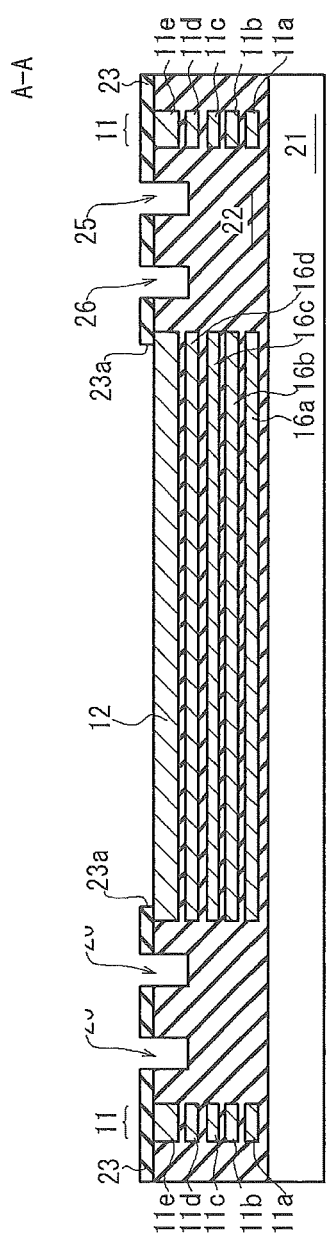
FIG. 12 is a section view illustrating the structure of the semiconductor wafer in the scribe region in the second embodiment.

FIG. 11 is an enlarged plan view illustrating details of an exemplary structure of a scribe region 2 of a semiconductor wafer in a second embodiment, and FIG. 12 is a section view illustrating the structure of the semiconductor wafer on the A-A section illustrated in FIG. 11. Note that the A-A section is orthogonal to the direction in which the guard rings 11 are extended (that is, the Y-axis direction).

As illustrated in FIGS. 11 and 12, the structure of the semiconductor wafer in this embodiment is similar to that of the semiconductor wafer in the first embodiment; the difference is that two grooves 25 and 26 are formed to pass between each guard ring 11 and the TEG pad 12 in the second embodiment. The grooves 25 and 26 are both extended in the Y-axis direction. The grooves 25 are disposed along the corresponding guard rings 11 and the grooves 26 are respectively disposed between the grooves 25 and the TEG pad 12 along the grooves 25. The side faces 25a and 25b of the grooves 25 are both parallel to the YZ plane, and the side faces 26a and 26b of the grooves 26 are both parallel to the YZ plane.

Figure 13:
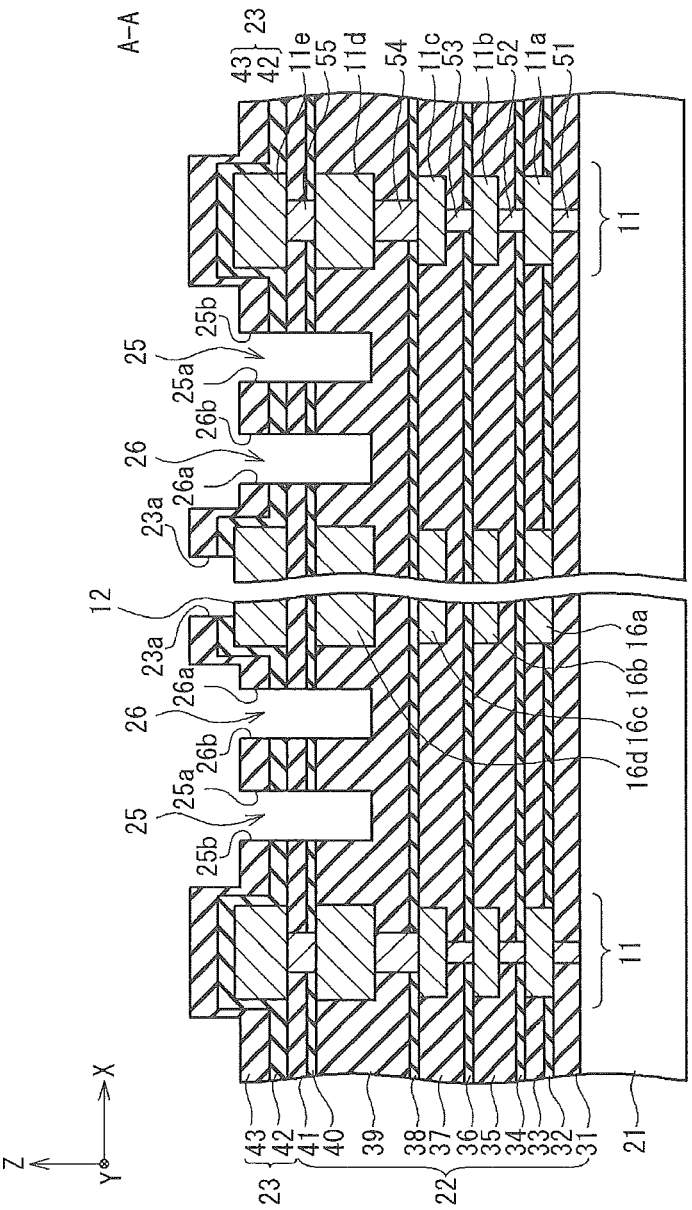
FIG. 13 is a section view illustrating details of the structure of the semiconductor wafer in the scribe region in the second embodiment.

FIG. 13 is a section view illustrating details of the structure of the semiconductor wafer in the second embodiment. The grooves 25 and 26 are formed to penetrate at least the surface protection layer 23 (that is, the silicon oxide film 42 and the silicon nitride film 43) in the depth direction. In this embodiment, the grooves 25 and 26 are formed to penetrate the surface protection layer 23 and to reach intermediate positions of the silicon oxide film 39 in the depth direction.

Such structure also permits reducing the width of the scribe regions 2, while suppressing the surface chipping. More specifically, the existence of the grooves 26, which are disposed close to the TEG pad 12, allows removing the TEG pad 12 in a dicing with a dicing blade having a thickness thinner than the width of the TEG pad 12 in the X-axis direction.

In detail, the use of a dicing blade having a thickness thinner than the width of the TEG pad 12 in the X-axis direction results in that there remain non-contact portions (which are not in direct contact with the dicing blade) in the TEG pad 12, as discussed in the first embodiment. The non-contact portions of the TEG pad 12 are, however, applied with forces to strip off the non-contact portions by the dicing blade and this allows removing the whole of the TEG pad 12 by making use of the forces for the semiconductor wafer of this embodiment. In the semiconductor wafer of this embodiment, in which the grooves 26 are disposed close to the TEG pad 12, forces applied to strip off the non-contact portions of the TEG pad 12 tend to be released at the grooves 26. In other words, the portions of the dielectric layer 22 and surface protection layer 23 between the side faces 26a of the grooves 26 and the TEG pad 12 tend to be broken when forces to strip off the non-contact portions are applied. Accordingly, the non-contact portions of the TEG pad 12, which are not in direct contact with the dicing blade, can be removed together with the portions of the dielectric layer 22 and surface protection layer 23 between the side faces 26a of the grooves 26 and the TEG pad 12.

As thus discussed, the structure of the semiconductor wafer in this embodiment permits performing a dicing with a dicing blade 50 thinner than the width of the TEG pad 12 in the X-axis direction. This enables reducing the width of the scribe regions 2.

The existence of the grooves 25 disposed far from the TEG pad 12, on the other hand, contributes to the suppression of surface chipping. Since the grooves 25 are disposed far from the TEG pad 12, the distance between the dicing blade and the grooves 25 are increased in the dicing. This implies that the effect of the grooves 25 is enhanced for stopping the growth of a crack which is generated when the dicing blade is placed into contact with the semiconductor wafer. Accordingly, the grooves 25, which are disposed far from the TEG pad 12, effectively suppress the surface chipping.

FIG. 14 is a plan view illustrating an exemplary structure of the side edge portion of a semiconductor IC chip obtained by a dicing in which a dicing blade is placed onto a position between the dashed lines 27 illustrated in FIG. 11, and FIG. 15 is a section view illustrating the structure of the side edge portion of the semiconductor IC chip. Also in this embodiment, a dicing is achieved by using a dicing blade 50 having a thickness thinner than the width of the TEG pad 12 in the X-axis direction. In FIG. 14, the numeral 28 denotes the cut surface of the dicing, that is, the side edge face of the semiconductor IC chip and the broken lines 12a indicate the position at which the TEG pad 12 has existed before the dicing.

When the dicing is performed with a dicing blade 50 having a thickness thinner than the width of the TEG pad 12 in the X-axis direction, a force is applied to strip off the TEG pad 12 near a position at which the TEG pad 12 has existed before the dicing. This force breaks down the surface protection layer 23 near a position at which the TEG pad 12 has existed before the dicing and removes the TEG pad 12.

In the resultant semiconductor IC chip, the side face opposed to the side edge face 28 of a groove 26 may be broken in the dicing. FIG. 15 illustrates the structure in which the side face opposed to the side edge face 28 of a groove 26 is partially broken. The face formed by the break-down in the dicing is, however, structurally distinguishable from the bottom and side faces of a groove 26 formed by etching. Accordingly, the existence of a groove 26 can be determined for an actual semiconductor IC chip.

As illustrated in FIG. 15, the portions between the cut surface and the guard ring 11 out of the metal wires 16a to 16d positioned under the TEG pad 12 remain in the semiconductor IC chip after the dicing. The existence of the remaining portions of the metal wires 16a to 16d may be evidence that a dicing blade 50 having a thickness thinner than the width of the TEG pad 12 in the X-axis direction is used in the dicing.

As thus described, the structure of the semiconductor wafer in this embodiment, in which two grooves 25 and 26 are disposed between each guard ring 11 and the TEG pad 12, permits reducing the width of the scribe regions 2, while suppressing the surface chipping.

Although embodiments of the present invention are specifically described in the above, the present invention should not be construed as being limited to the above-described embodiments; the present invention may be implemented with various modifications which do not depart from the scope of the invention.

What is claimed is:

1. A semiconductor wafer, comprising:
   a plurality of circuit integration regions each incorporating an integrated circuit;
   a plurality of guard rings disposed to surround said plurality of circuit integration regions, respectively;
   a scribe region disposed between adjacent two of said plurality of guard rings;
   an element disposed in said scribe region;
   a pad disposed in said scribed region and electrically connected to said element; and
   a groove disposed along one of said adjacent two of guard rings on a front surface of said semiconductor wafer,
   wherein said groove is disposed to pass between said pad and said one of said adjacent two of guard rings, and
   wherein a first distance between said pad and said groove on a first section which passes said pad and is orthogonal to an extending direction in which said one of said adjacent two of guard rings is extended is different from a second distance between said pad and said groove on a second section which passes said pad and is orthogonal to said extending direction, said second section being positioned at a position different from that of said first section in said extending direction.

2. The semiconductor wafer according to claim 1, wherein a third distance between said pad and said groove on a third section which passes said pad and is orthogonal to said extending direction is larger than said first distance and smaller than said second distance, said third section being positioned between said first and second sections.

3. The semiconductor wafer according to claim 1, wherein said groove is formed in a shape which is periodical in said extending direction.

4. A semiconductor wafer, comprising:
a plurality of circuit integration regions each incorporating an integrated circuit;
a plurality of guard rings disposed to surround said plurality of circuit integration regions, respectively;
a scribe region disposed between adjacent two of said plurality of guard rings;
an element disposed in said scribe region;
a pad disposed in said scribed region and electrically connected to said element; and
first and second grooves disposed on a front surface of said semiconductor wafer,
wherein said first and second grooves are disposed to pass between said pad and said one of said adjacent two of guard rings,
wherein said first groove is disposed between one of said adjacent two of guard rings and said pad to extend along said one of said adjacent two of guard rings, and
wherein said second groove is disposed between said first groove and said pad to extend along said first groove.

5. A semiconductor IC chip, comprising:
a circuit integration region incorporating an integrating circuit; and
a guard ring disposed to surround said circuit integration region,
wherein a groove is formed on a front surface of said semiconductor IC chip along said guard ring to pass between art side edge face of said semiconductor IC chip and said guard ring, and
wherein, in an orthogonal direction to a lateral extension direction of said guard ring, a first distance between said side edge face and a first side surface of said groove is different from a second distance between said side edge face and a second side surface of said groove which is positioned at a position different from that of said first side surface in said lateral extension direction of said guard ring.

6. A semiconductor IC chip, comprising:
a circuit integration region incorporating an integrating circuit; and
a guard ring disposed to surround said circuit integration region,
wherein a first groove is formed on a front surface of said semiconductor IC chip to pass between an side edge face of said semiconductor IC chip and said guard ring, said first groove extending along said guard ring, and
wherein a second groove is formed on the front surface of said semiconductor IC chip between said side edge face and said first groove, said second groove extending along said first groove.

7. The semiconductor IC chip according to claim 6, wherein, in a plan view, said side edge face of said semiconductor IC chip extends parallel to the first side surface of said groove.

8. The semiconductor IC chip according to claim 6, wherein, in the plan view, said side edge face of said semiconductor IC chip extends parallel to the second side surface of said groove.

9. The semiconductor IC chip according to claim 6, wherein, in the orthogonal direction to the lateral extension direction of said guard ring, a third distance between said side edge face and a third side surface of said groove is less than the second distance between said side edge face and the second side surface of said groove.

10. The semiconductor IC chip according to claim 9, wherein, in the orthogonal direction to the lateral extension direction of said guard ring, the third distance between said side edge face and the third side surface of said groove is more than the first distance between said side edge face and the second side surface of said groove.

11. The semiconductor IC chip according to claim 10, wherein, in a plan view, said side edge face of said semiconductor IC chip extends parallel to the third side surface of said groove.

12. The semiconductor IC chip according to claim 11, wherein, in the plan view, said side edge face of said semiconductor IC chip extends parallel to the first and second side surfaces of said groove.

13. The semiconductor IC chip according to claim 6, wherein, in a plan view, an entirety of a side face of said groove that faces the guard ring extends parallel to said side edge face of said semiconductor IC chip.

14. The semiconductor IC chip according to claim 13, wherein, in the plan view, another side face of said groove that faces said semiconductor IC chip includes a stepped structure.

15. The semiconductor IC chip according to claim 14, wherein, in the plan view, the stepped structure includes the first side surface of said groove extending parallel to the side face of said groove, and the second side surface of said groove extending parallel to the side face of said groove.

16. The semiconductor IC chip according to claim 15, wherein, in the plan view, the stepped structure further includes a third side surface of said groove extending orthogonal to the side face of said groove.

17. The semiconductor IC chip according to claim 16, wherein, in the plan view, a distance between the third side surface of said groove and said side edge face of said semiconductor IC chip increases as the third side surface of said groove extends from the first side surface of said groove toward the second side surface of said groove.

18. The semiconductor IC chip according to claim 16, wherein, in the plan view, a distance between the third side surface of said groove and said side edge face of said semiconductor IC chip increases as the third side surface of said groove extends in the orthogonal direction to the lateral extension direction of said guard ring between the guard ring and the semiconductor IC chip.

* * * * *